US007405568B2

(12) United States Patent
Nemoto

(10) Patent No.: US 7,405,568 B2
(45) Date of Patent: Jul. 29, 2008

(54) METHOD AND APPARATUS FOR DIGITAL QUADRATURE LOCK-IN DETECTION IN MAGNETIC RESONANCE

(75) Inventor: Nobuaki Nemoto, Tokyo (JP)

(73) Assignee: Jeol Ltd., Tokyo (JP)

( * ) Notice: Subject to any disclaimer, the term of this patent is extended or adjusted under 35 U.S.C. 154(b) by 75 days.

(21) Appl. No.: 11/474,100

(22) Filed: Jun. 23, 2006

(65) Prior Publication Data
US 2007/0010733 A1    Jan. 11, 2007

(30) Foreign Application Priority Data
Jun. 27, 2005    (JP)    ............................. 2005-186367

(51) Int. Cl.
    *G01V 3/00*    (2006.01)
(52) U.S. Cl. ....................... 324/322; 375/321
(58) Field of Classification Search ................. 324/322, 324/318; 375/321, 324
    See application file for complete search history.

(56) References Cited

U.S. PATENT DOCUMENTS 4,803,700 A * 2/1989 Dewey et al. ............... 375/321
4,992,736 A * 2/1991 Stormont et al. ............ 324/309
5,907,585 A * 5/1999 Suzuki et al. ............... 375/324
2005/0093545 A1    5/2005 Yoshizawa
2005/0099182 A1    5/2005 Park et al.

FOREIGN PATENT DOCUMENTS

| JP | 4-327835 | 11/1992 |
| JP | 04-357937 | 12/1992 |
| JP | 05-317285 | 12/1993 |
| JP | 10-099293 | 4/1998 |

* cited by examiner

*Primary Examiner*—Louis M Arana
(74) *Attorney, Agent, or Firm*—The Web Law Firm

(57) ABSTRACT

A method and apparatus for digital quadrature lock-in detection capable of receiving magnetic resonance signals or electron spin resonance signals at high sensitivity. The method starts with digitizing a signal wave consisting of a magnetic resonance or electron spin resonance signal. The digitized signal wave is multiplied by digitized reference waves of sine and cosine functions to obtain signals of real and imaginary parts which are 90° out of phase (multiplying step). The frequencies of the sine and cosine functions are varied according to the observation width. The multiplying step is repeated.

6 Claims, 6 Drawing Sheets

METHOD AND APPARATUS FOR DIGITAL QUADRATURE LOCK-IN DETECTION IN MAGNETIC RESONANCE

BACKGROUND OF THE INVENTION

1. Field of the Invention

The present invention relates to a method and apparatus for digital quadrature lock-in detection in magnetic resonance.

2. Description of Related Art

Analog Quadrature Detection

FIG. 7 is a block diagram showing an example of the configuration of an NMR (nuclear magnetic resonance) spectrometer. The spectrometer has a pulse sequencer 1 producing RF (Radio Frequency) pulses that enter a direct digital synthesizer (DDS) daughter card 2, where given processing is performed. The daughter card 2 consists of a digital direct synthesizer (DDS) 2a, a D/A (digital to analog) converter (DAC) 2b, and a low-pass filter 2c. The DDS daughter card 2 produces pulses of 9 to 12 MHz.

The RF pulse then enters a following transmitter 3. The transmitter 3 includes a mixer 3a and an attenuator (ATT) 3c for attenuating the output from the mixer 3a, which mixes the output from the DDS daughter card 2 and the output from a distributor 3b. The output from the attenuator 3c is amplified by a following power amplifier 4 and applied to a probe 6. An NMR signal detected by the probe 6 is passed to an OBS receiver 10 via a duplexer (DPLX) 5 and a preamplifier 7.

In the OBS receiver 10, the NMR signal is mixed with a locally generated (LO) signal from a frequency synthesizer (FSY) 20 by an image reject mixer (IRM) 11. The signal from the synthesizer 20 is selected by an FSY selector 12 and applied to the image reject mixer 11, where the signal is mixed with the signal from the preamplifier 7. The output signal from the mixer 11 has an intermediate frequency (IF). The output from the image reject mixer 11 is passed through a bandpass filter 13 that passes only frequencies of 9 to 12 MHz. The output signal from the filter 13 is split into two by a splitter 14.

An intermediate frequency (IF) is generated by a digital direct synthesizer (DDS) 15 and passed to mixers 17a and 17b through D/A (Digital to Analog) converters (DACs) 16a and 16b, respectively. The two signals from the splitter 14 are mixed with intermediate-frequency (IF) signals which are 90° out of phase at the mixers 17a and 17b, respectively. The output signals from the mixers 17a and 17b are passed through AF (audio frequency) filters 18a and 18b, respectively, to remove unwanted RF components. The output signals from the filters 18a and 18b are converted into digital signals by A/D (Analog to digital) converters (ADCs) 31a and 31b, respectively. The resulting data are temporarily held in a signal processing portion 32. One of the two digital signals is herein referred to as a real part, while the other is referred to as an imaginary part. In this case, any one of them may be a real part.

Digital Quadrature Detection

FIG. 8 is a block diagram showing a second example of the configuration of an NMR spectrometer. Like components are indicated by like reference numerals in both FIGS. 7 and 8. In analog quadrature detection shown in FIG. 7, two signals, which originate from the digital direct synthesizer (DDS) 15 and are applied as IF signals to the mixers, are out of phase. In contrast, in the configuration shown in FIG. 8, one phase signal is converted into an analog signal by a DAC 16b and then mixed with an NMR signal at a mixer 17b. However, when the signal is accepted into the ADC 31b, it is necessary that the signal be oversampled at a frequency more than twice as high as the required spectral width SW.

FIG. 1 is a conceptual diagram illustrating digital quadrature detection underlying the concept of the present invention, and depicts subsequent processing on digital data obtained by the signal processing portion 32. Time domain data stored in a data buffer 40 are copied as two data sets. One data set is multiplied by sin Ωt, while the other is multiplied by cos Ωt. The products are passed through digital low-pass filters (D-LPFs) 42a and 42b, respectively, and stored in data buffers 2R and 2I, respectively. The stored data sets are taken as real and imaginary data, respectively. The data buffers 2R and 2I are indicated by 43a and 43b, respectively.

Summary and Principle of Lock-In Amplifier

Summary and principle of a lock-in amplifier are next described. FIG. 2 illustrates lock-in detection and the principle of a lock-in amplifier. It is assumed that an observed signal consists of a single frequency. The observed signal can be given by sin ($\omega t+\alpha$). A case is discussed in which a reference signal is prepared and brought into coincidence with the observed signal in terms of frequency or the frequency is swept for coincidence.

If the coincidence is achieved, the reference signal can be given by sin ($\omega t+\beta$). If the product of the reference signal sin ($\omega t+\beta$) and observed signal sin ($\omega t+\alpha$) is calculated by a multiplier 45, formulas of products and sums of trigonometric functions state that the output from the multiplier 45 is given by $$\cos(2\omega t+\alpha+\beta)-\cos(\alpha-\beta)$$

Of this formula, the former term is an AC component varying with time. The latter term is a DC component not varying with time.

Only the DC component $-\cos(\alpha-\beta)$ can be obtained by cutting off RF components by a low-pass filter (LPF) 46 having a cutoff frequency lower than $2\omega$ and passing only low-frequency components. Generally, noise can be blocked by cutting off the region other than a band of interest by a filter. In the case of this lock-in amplifier, noise components located outside a band of reference signal ±about cutoff frequency can be blocked because the cutoff frequency of the low-pass filter 46 can be set to a very low frequency. As a result, low-noise detection is enabled. Hence, this lock-in amplifier is often used for high-sensitivity measurements. This detection system is referred to as the lock-in amplifier.

Quadrature Lock-In Detection

Quadrature lock-in detection is next described. The reference signal shown in FIG. 2 is sin ($\omega t+\beta$). The phase is not definite. The signal cannot be observed depending on the value of $\beta$ and thus the phase of the observed signal cannot be known. (Usually, the phase is to be optimized.) To avoid this, a quadrature lock-in amplifier is available.

FIG. 3 illustrates quadrature lock-in detection. Like components are indicated by like reference numerals in both FIGS. 2 and 3. In this quadrature lock-in amplifier, an observed signal is multiplied by reference signals by means of multipliers 45 and 45a, respectively. The observed signal is split into two parts which are multiplied by reference signals which are 90° out of phase (e.g., sine wave and cosine wave, respectively). The products are passed through low-pass filters 46 and 46a, respectively, in the same way as in the above-described example. They are observed as two out of phase signals. Where the reference signal is sin ($\omega t+\beta$), the DC output signal from the low-pass filter 46 is $-\cos(\alpha-\beta)$. Where the reference signal is cos ($\omega t+\beta$), the DC output signal from the low-pass filter 46a is sin ($\alpha-\beta$).

Thus, signals can be received with at least one of the two channels without depending on the phases of the observed signal α and reference signal β. Furthermore, the phase of the observed signal relative to the reference signal can be known. Note that symbols and coefficient ½ are omitted in FIGS. 2 and 3.

Digital Lock-In Detection

Digital lock-in detection is next described. The above-described lock-in amplifier can be digitized. FIG. 4 illustrates digital lock-in detection. An analog observed signal sin (ωt+α) is entered. An A/D converter 47 converts the observed signal into a sequence of digital numerical values varying with time. The converted observed signal is input to one input terminal of a multiplier 48. A digital reference signal sin (ωt+α) is input to the other input terminal of the multiplier 48.

The reference signal is multiplied by a sequence of numerical values corresponding to a sine wave. The obtained sequence of numerical values is passed through a digital low-pass filter 49. In this way, a sequence of digital numerical values −cos (α−β) corresponding to a DC signal can be obtained. A lock-in amplifier that has been digitized in this way can also be available. In addition, a digital quadrature lock-in amplifier can also be achieved by combination with the circuit shown in FIG. 3.

An apparatus of this kind is known as disclosed, for example, in Japanese Patent Laid-Open No. H10-99293 (paragraphs 0008-0012; FIGS. 1 and 2). In this technique, real and imaginary part data are obtained by DPSD complex detection based on a 4-fold oversampling technique, and the difference in amplitude between the real and imaginary part data is reduced. Furthermore, a technique regarding improvement of a quadrature phase detection technique for performing quadrature phase detection of a signal from the receiver coil of a magnetic resonance imaging apparatus is known (see, for example, Japanese Patent Laid-Open No. H5-317285 (paragraphs 0016-0034; FIGS. 1 and 3).

Another technique for reconstructing a magnetic resonance signal is also known as disclosed, for example, in Japanese Patent Laid-Open No. H4-357937 (paragraphs 0015-0022; FIG. 6). The magnetic resonance signal is separated into two signals by detection using two reference waves having resonance frequencies that are 90° out of phase. The detected signals are Fourier transformed and corrected in the Fourier space, thus removing noise. Then, the signal is reconstructed.

In the case of the aforementioned analog quadrature detection, two different A/D converters (ADCs) are used. Therefore, it is difficult to make uniform the converters in gain and DC offset. Accordingly, there is the problem that image artifacts and center glitch (artifacts caused by frequency offset) tend to be produced. Furthermore, generally, in magnetic resonance phenomena (especially, nuclear magnetic resonance phenomena such as NMR and MRI), quite weak energies are treated. Therefore, the sensitivity is low in principle. Accordingly, improving the sensitivity is quite important in developing magnetic resonance apparatus.

SUMMARY OF THE INVENTION

It is an object of the present invention to provide a method and apparatus for digital quadrature lock-in detection permitting high-sensitivity observation of signals in magnetic resonance spectroscopy.

A first aspect of the present invention provides a method of receiving a magnetic resonance signal or electron spin resonance signal by a digital quadrature detection technique. A digitized signal wave is multiplied by digitized reference waves of sine and cosine functions, resulting in signals of real and imaginary parts which are 90° out of phase. The frequencies of the sine and cosine functions are varied according to the observation width. This calculation in which the signal wave is multiplied by the reference waves is repeated.

A second aspect of the present invention provides an apparatus for receiving a magnetic resonance signal or electron spin resonance signal by a digital quadrature detection technique. The signal is sampled at a frequency higher than a required frequency band, producing digital data. The digital data are detected by a quadrature digital detection technique. At this time, the signal wave is repetitively multiplied by plural different frequency-variable sine or cosine functions between {a fixed frequency−(required bandwidth)/2)} and {the fixed frequency+(required bandwidth)/2)}, using the same principle as a digital lock-in amplifier. The resulting signals are passed through a narrow-band digital low-pass filter to cut off unwanted components. Thus, only DC components are extracted.

According to the present invention, magnetic resonance signals can be received at higher sensitivity than heretofore.

Other objects and features of the invention will appear in the course of the description thereof, which follows.

DESCRIPTION OF THE PREFERRED EMBODIMENTS

Embodiments of the present invention are hereinafter described in detail with reference to the drawings.

Figure 5:
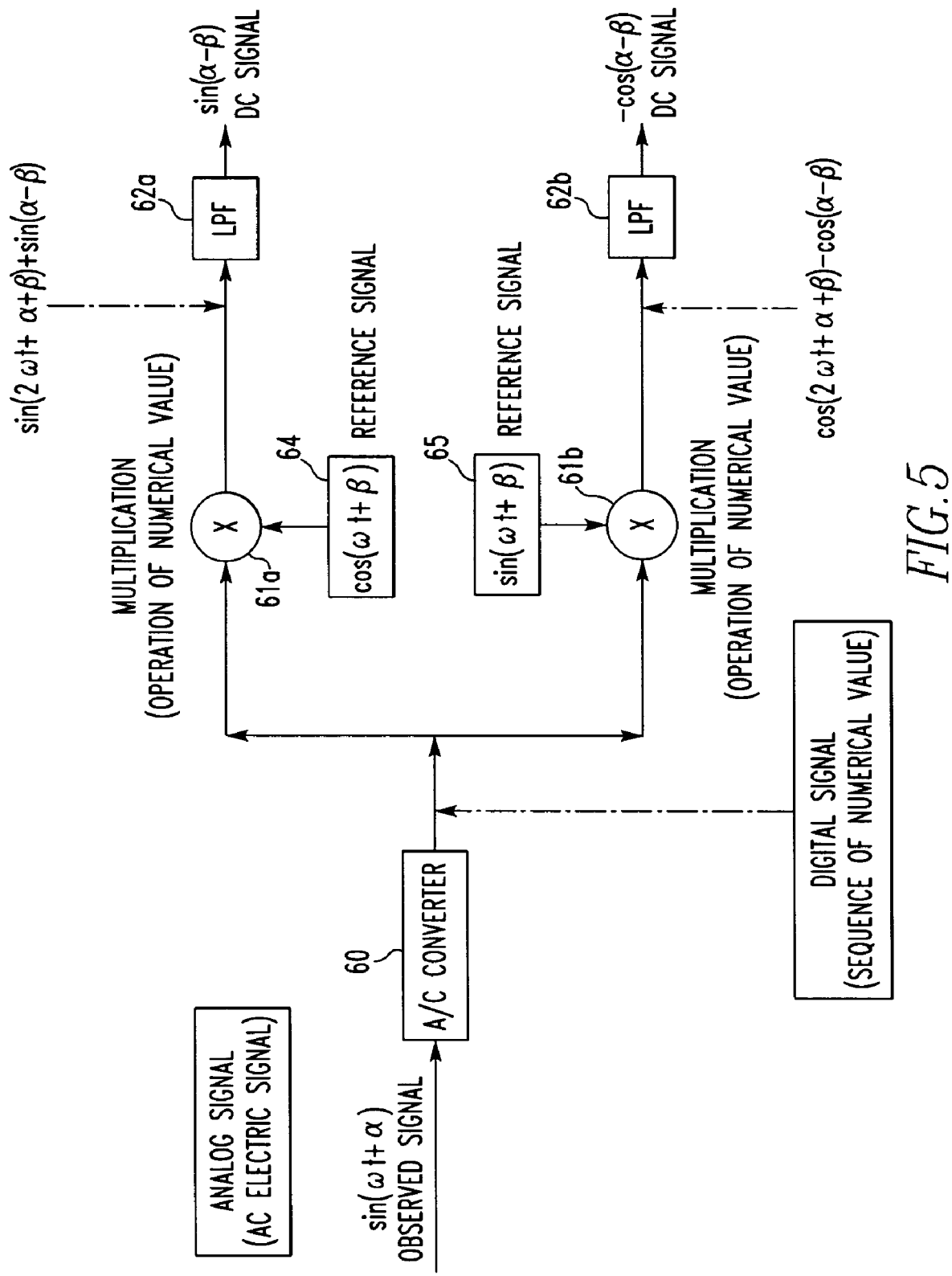
FIG. 5 is a block diagram of main portions of an apparatus according to the present invention.

FIG. 5 is a block diagram showing main portions of an apparatus according to the present invention. An observed signal can be given by sin (ωt+α). The observed signal enters an ADC 60, where the signal is converted into digital data. The digital data are passed as a sequence of digital numerical values into multipliers 61a and 61b. Reference signals cos (ωt+β) and sin (ωt+β) are applied to the multipliers 61a and 61b, respectively. In the multipliers 61a and 61b, split parts of the observed signals are multiplied by the reference signals cos (ωt+β) and sin (ωt+β), respectively. The output signals from the multipliers 61a and 61b are passed through digital low-pass filters (LPFs) 62a and 62b, respectively, so that high-frequency components are removed. As a result, the output signals from the filters 62a and 62b are DC signals sin (α−β) and −cos (α−β), respectively.

The output from the multiplier 61a is given by sin (2ωt+α+β)+sin (α−β). On the other hand, the output from the multiplier 61b is given by cos (2ωt+α+β)−cos (α−β).

Embodiment 1

Figure 1:
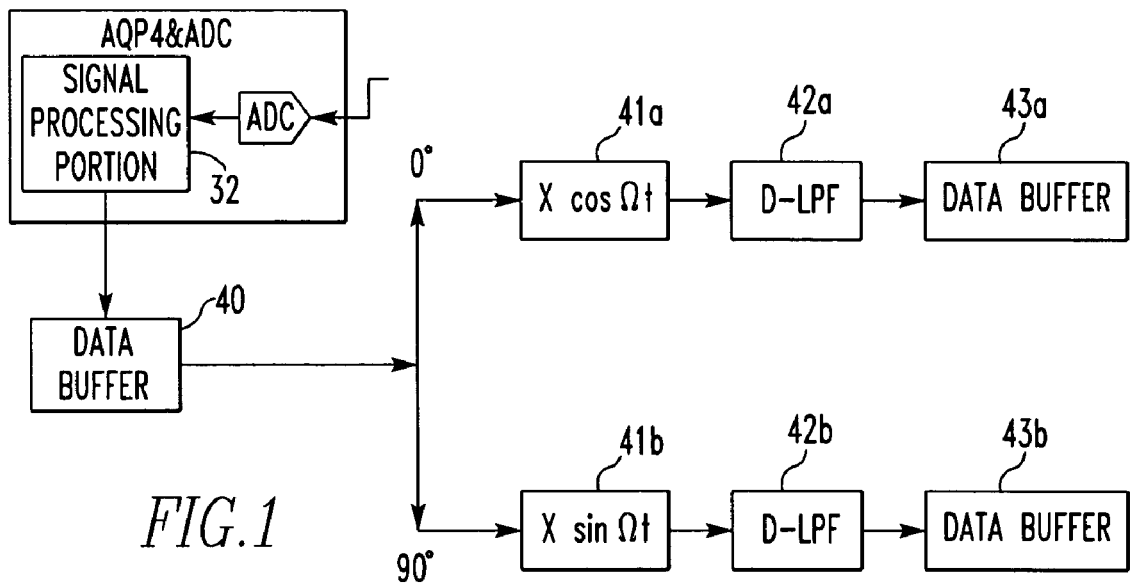
FIG. 1 is a conceptual diagram of digital quadrature detection performed in the present invention.
Figure 2:
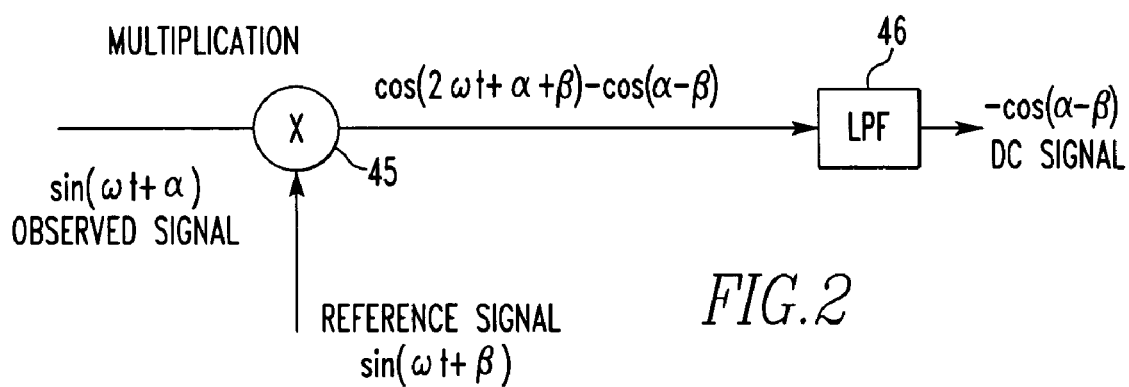
FIG. 2 is a diagram illustrating lock-in detection.
Figure 3:
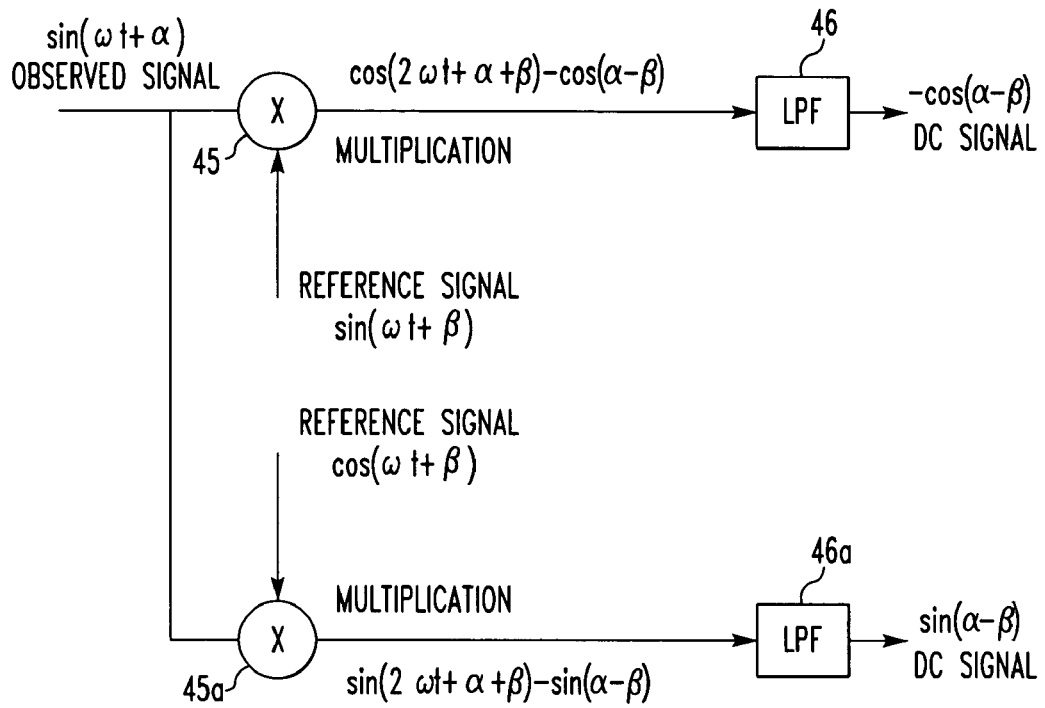
FIG. 3 is a diagram illustrating quadrature lock-in detection.
Figure 7:
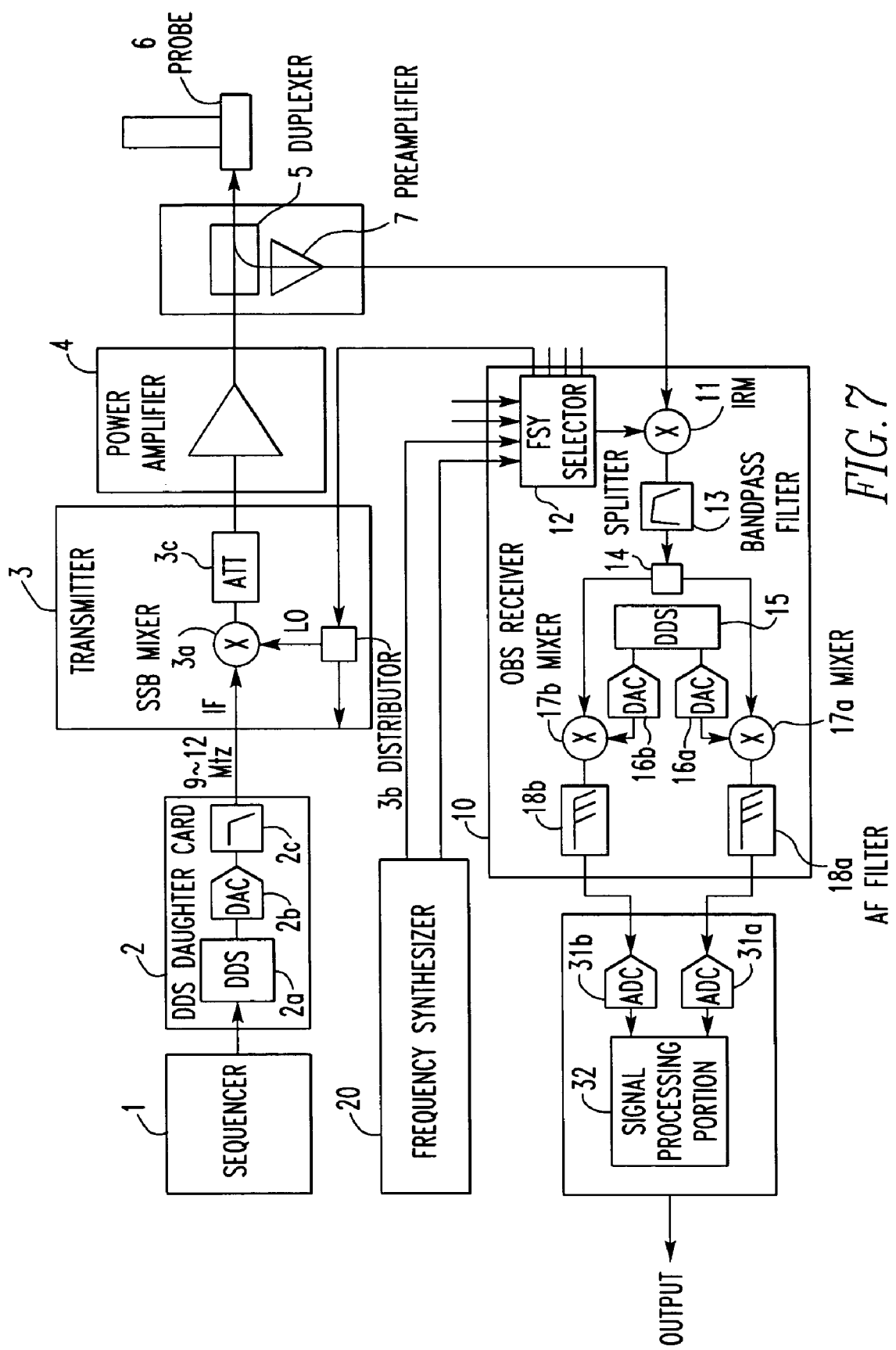
FIG. 7 is a block diagram showing a first example of configuration of an NMR spectrometer.
Figure 8:
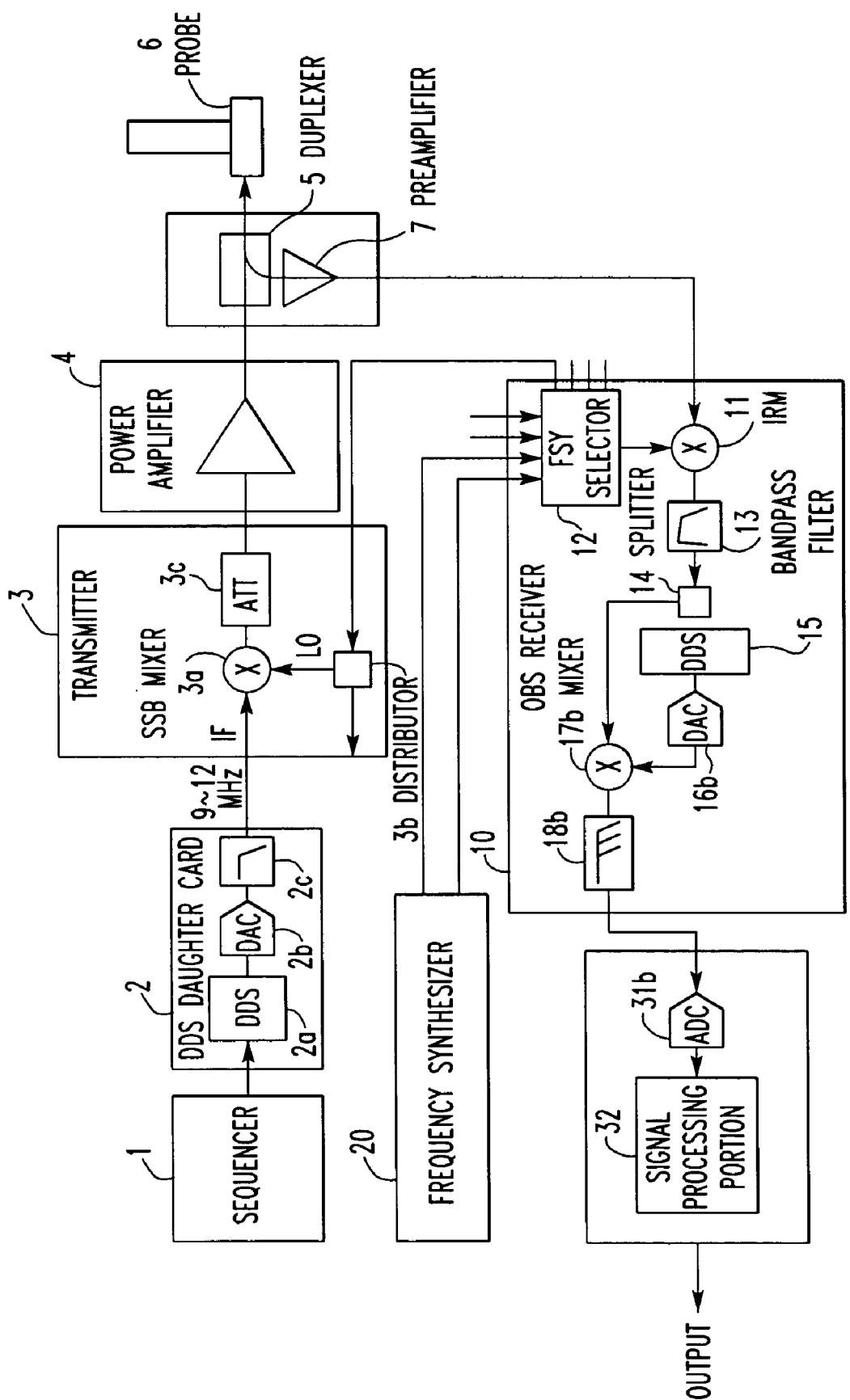
FIG. 8 is a block diagram showing a second example of configuration of an NMR spectrometer.

The hardware configuration of an apparatus according to an embodiment of the present invention is similar to the configuration shown in FIGS. 7 and 8 except that audio filters 18a, 18b, A/D converters 31a, 31b, signal processing portion 32, and other components cope with sampling at high frequencies above approximately 2 MHz. Digital data accepted by the signal processing portion 32 are computed as shown in FIG. 1. The computation is performed serially every one NMR data set obtained by sampling. For this purpose, a high-speed board computer or digital signal processor (DSP) is required as the signal processing portion of relatively high computational speed. The signal processing portion is a device for processing data that the spectrometer receives. A serial detection NMR instrument can be implemented in this embodiment.

Figure 6:
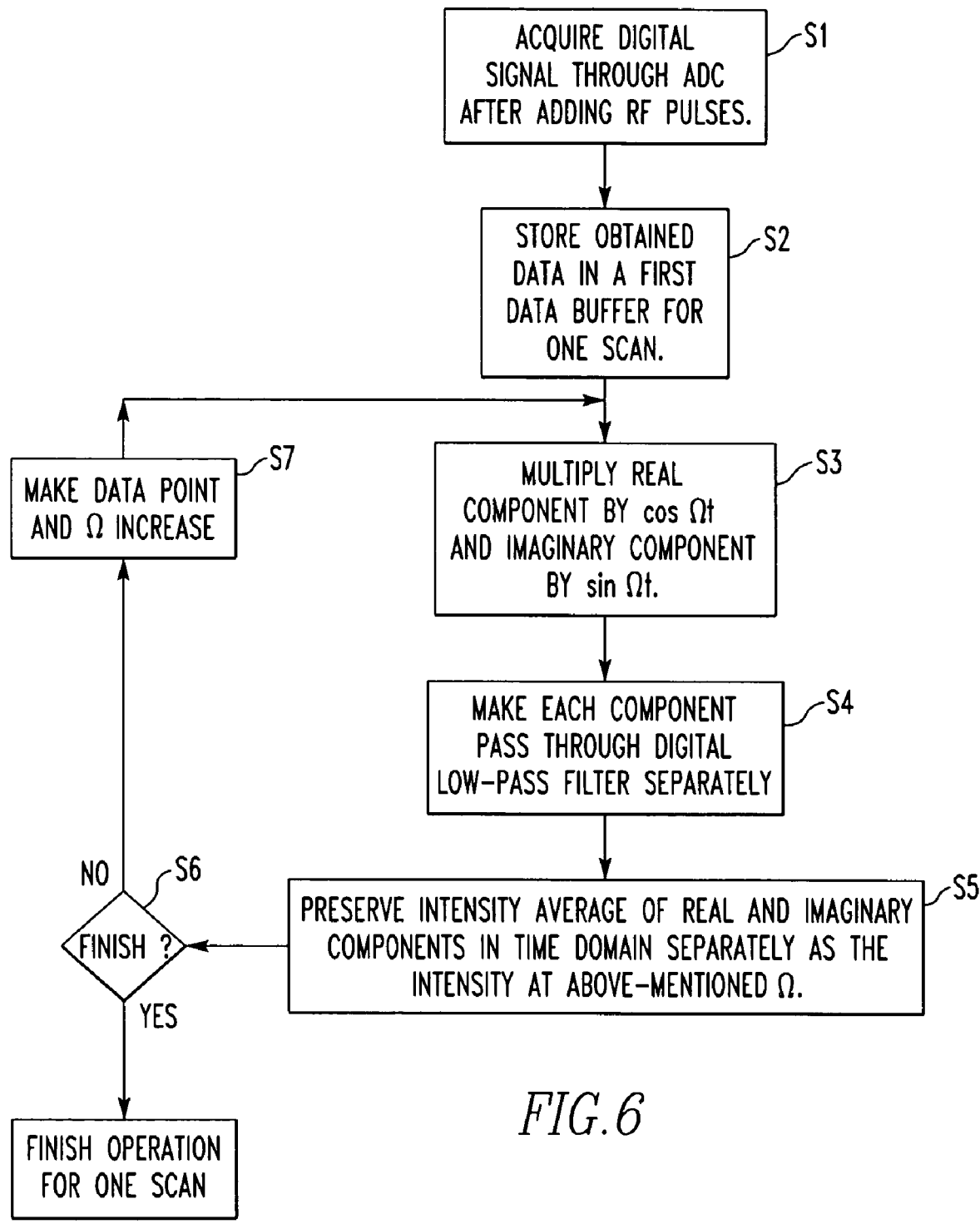
FIG. 6 is a flowchart illustrating one example of sequence of operations of the apparatus according to the present invention.

FIG. 6 is a flowchart illustrating one example of sequence of operations of the apparatus according to the present invention.

1) An NMR signal detected by the probe 6 enters the IRM (image reject mixer) 11 through the duplexer 5 and preamplifier 7. In this mixer 11, the NMR signal is mixed with a locally generated signal from the frequency synthesizer 20. As a result, the output signal from the mixer has an intermediate frequency (IF). The signal from the mixer (IRM) 11 is passed through the filter 13 to pass only a given frequency band of 9 to 12 MHz. The IF signal produced from the digital direct synthesizer (DDS) 15 and passed through the DAC 16b is mixed with NMR signals in the mixer 17b.

Figure 4:
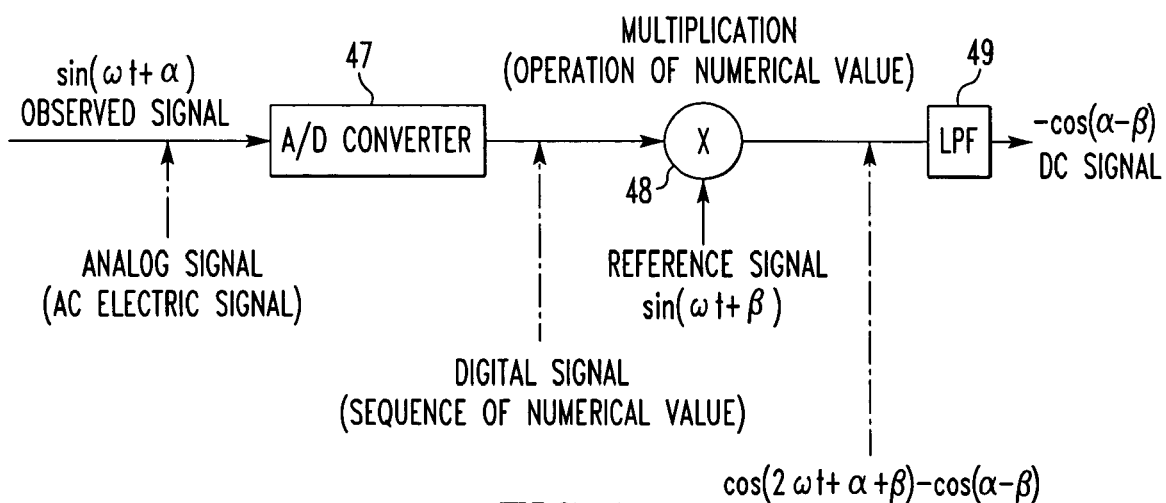
FIG. 4 is a diagram illustrating digital lock-in detection.

Then, unwanted RF components are removed by the AF filter 18b. The analog signal is converted into a digital signal by the ADC 31b (step S1). The resulting data is temporarily held in a memory within the signal processing portion 32. The processing is the same as the processing of digital quadrature detection already described in connection with FIG. 4 up to this point.

2) The obtained data is then stored in a first data buffer 40 (FIG. 1) for one scan (step S2). The data items are arrayed in the time-sequential order. The data set is copied to create two copy sets (hereinafter may be referred to as raw data). The first copy set is described below.

The raw data are multiplied by $\cos \Omega t$ in the time-sequential order and then passed through digital low-pass filter (D-LPF) 42a.

3) At this time, the cutoff frequency of the digital low-pass filter 42a is adjusted to be comparable to or lower than the digital resolution (e.g., 10 Hz) obtained by dividing the spectral width SW by the number of data points NP (step S3). For example, where SW=10 kHz and NP=1000, the digital resolution is 10 Hz. The data sets are separately passed through a narrow-band digital low-pass filter (D-LPF) 49 (step S4). A maximum intensity or time-averaged value of the obtained numerical values is stored in a data buffer 2R. As a result, only signal intensities having the same frequency as $\Omega$ are stored in the data buffer 2R.

4) In the same way as in the above-described operations regarding the first data set, the raw data are multiplied by $\sin \Omega t$ in the time-sequential order (step S3). Then, the resulting data are passed through the digital low-pass filter 42b (step S4). A maximum intensity or time-averaged value of the obtained numerical values is stored in the data buffer 2I. As a result, the intensities of only signals which have a frequency equal to $\Omega$ and whose phase is different by 90° from the phase used in the above-described case are stored in the data buffer 2I (step S5).

5) The above-described sequence of operations is then repeated as many times as a desired number of data points (NP times) with varied $\Omega$ (e.g., $\Omega - \Delta\Omega$). During these operations, the amount of variation of $\Omega$ is NP×$\Delta\Omega$=SW. Control goes to step S6, where a decision is made as to whether the processing of step S5 has completed (step S6). If the result of the decision is affirmative (Yes), it follows that one process of FID (free induction decay) has been completed. If the decision is negative (No), the data point and $\Omega$ are incremented (step S7). Control then returns to step S3. Thus, the intensities of signals which agree with frequencies from one end to the other end of the observation width SW can be recorded. Consequently, an NMR spectrum can be detected.

In this way, according to the present invention, magnetic resonance signals can be received at higher sensitivity than heretofore.

Embodiment 2

The hardware configuration of an apparatus according to the present embodiment of the invention is similar to the configuration shown in FIGS. 7 and 8 except that audio filters 18a, 18b, A/D converters 31a, 31b, signal processing portion 32, and other components cope with sampling at high frequencies above approximately 2 MHz. Digital data accepted by the signal processing portion 32 are computed as shown in FIG. 1. The computation is performed serially every one NMR data set obtained by sampling. For this purpose, a high-speed board computer or digital signal processor (DSP) is required as the signal processing portion of relatively high computational speed. The signal processing portion is a device for processing data that the spectrometer receives. A batch detection NMR instrument can be implemented in this embodiment. The sequence of operations of the instrument constructed in this way is described by referring to the flowchart of FIG. 6.

1) An NMR signal detected by the probe 6 enters the IRM (image reject mixer) 11 through the duplexer 5 and preamplifier 7. In this mixer 11, the NMR signal is mixed with a locally generated signal from the frequency synthesizer 20. As a result, the output signal from the mixer has an intermediate frequency (IF). The signal from the mixer 11 is passed through the bandpass filter 13 to pass only a given frequency band of 9 to 12 MHz. The IF signal produced from the digital direct synthesizer (DDS) 15 and passed through the DAC 16b is mixed with NMR signals in the mixer 17b.

Then, unwanted RF components are removed by the AF filter 18b. The analog signal is converted into a digital signal by the ADC 31b (step S1). The resulting data is temporarily held in a buffer within the signal processing portion 32. The processing is the same as the processing of digital quadrature detection already described up to this point. Since the computational speed is low, oversampled data are once held. After the end of NMR experiments, the following calculations are performed.

2) The obtained data is stored in a first data buffer 40 for one scan (step S2). The data items are arrayed in the time-sequential order. The data set is copied to create two copy sets (hereinafter may be referred to as raw data).

3) The first copy set is next described.

The raw data are multiplied by $\cos \Omega t$ in the time-sequential order (step S3). Then, the resulting data are passed through the digital low-pass filter (D-LPF) 49 (step S4). The cutoff frequency of the filter 49 is adjusted to be comparable to or lower than the digital resolution (e.g., 10 Hz) obtained by dividing the spectral width SW by the number of data points NP. For example, where SW=10 kHz and NP=1000, the digital resolution is 10 Hz.

A maximum intensity or time-averaged value of the obtained numerical values is stored in the data buffer 2R. As a result, only signal intensities having the same frequency as $\Omega$ are accumulated in the data buffer 2R.

4) In the same way as in the above-described session of operations 3), the raw data are multiplied by sin $\Omega t$ in the time-sequential order. Then, the resulting data are passed through the digital low-pass filter 42b. A maximum intensity or time-averaged value of the obtained numerical values is stored in the data buffer 2I (step S5). As a result, the intensities of only signals which have a frequency equal to $\Omega$ and whose phase is different by 90° from the phase used in the above-described session 3) are accumulated in the data buffer 2I.

5) A decision is made as to whether the processing has been completed (step S6). If the result of the decision is affirmative (Yes), it follows that one process of FID (free induction decay) has been completed. If the decision is negative (No), the above-described operations 3) and 4) are repeated as many times as a desired number of data points (NP times) with varied $\Omega$ (e.g., $\Omega-\Delta\Omega$) (step S7). During these operations, the amount of variation of $\Omega$ is NP×$\Delta\Omega$=SW. Thus, signal intensities which agree with frequencies from one end to the other end of the observation width SW can be recorded. Consequently, an NMR spectrum can be detected.

In this way, according to the present invention, magnetic resonance signals can be received at higher sensitivity than heretofore.

Having thus defined our invention with the detail and particularity required by the Patent Laws, what is desired protected by Letters Patent is set forth in the following claims.

The invention claimed is:

1. A method of digital quadrature lock-in detection for receiving a magnetic resonance signal or electron spin resonance signal by a digital quadrature lock-in detection technique, said method comprising the steps of:
    digitizing a signal wave;
    multiplying said digitized signal wave by digitized reference waves of sine and cosine functions to obtain signals of real and imaginary parts which are 90° out of phase;
    varying the frequencies of the sine and cosine functions according to an observation width; and
    repeating said multiplying step,
    wherein high-frequency components are removed from the signal waves, which have been multiplied by the reference waves of said digitized sine and cosine functions, by a low-pass filter, said low-pass filter having a cutoff frequency comparable to or lower than a digital resolution obtained by dividing an observed spectral width by the number of data points.

2. A method of digital quadrature lock-in detection as set forth in claim 1, wherein the step of digitizing said signal wave is performed using a single analog-to-digital converter.

3. A method of digital quadrature lock-in detection as set forth in claim 2, wherein the signal wave digitized by said single analog-to-digital converter is split into a signal wave for a real part and a signal wave for an imaginary part and then these signal waves are multiplied by said digitized reference waves of sine and cosine functions, respectively.

4. An apparatus for digital quadrature lock-in detection adapted to receive a magnetic resonance signal or electron spin resonance signal by a digital quadrature detection technique, said apparatus comprising:
    means for obtaining digital data by sampling the signal at a frequency higher than a required bandwidth;
    means for detecting said digital data by a quadrature detection technique using the same principle as a digital lock-in amplifier to thereby obtain a digitized signal wave;
    means for repetitively multiplying the digitized signal wave by plural different frequency-variable sine or cosine functions between {a fixed frequency —(required bandwidth)/2)} and {the fixed frequency+(required bandwidth)/2)}; and
    a narrow-band digital low-pass filter for cutting off unwanted components of the obtained signals, thus extracting only DC components,
    wherein said narrow-band digital low-pass filter has a cut-off frequency comparable to or lower than a digital resolution obtained by dividing the observed spectral width by the number of data points.

5. An apparatus for digital quadrature lock-in detection as set forth in claim 4, wherein digitization of said signal wave is performed using a single analog-to-digital converter.

6. An apparatus for digital quadrature lock-in detection as set forth in claim 5, wherein the signal wave digitized by said single analog-to-digital converter is split into a signal wave for a real part and a signal wave for an imaginary part and then these signal waves are repetitively multiplied by said digitized sine or cosine functions.

* * * * *